United States Patent
Becken et al.

(10) Patent No.: US 7,597,603 B2
(45) Date of Patent: Oct. 6, 2009

(54) METHOD OF ENCAPSULATING A DISPLAY ELEMENT

(75) Inventors: Keith James Becken, Bath, NY (US); Stephan Lvovich Logunov, Corning, NY (US)

(73) Assignee: Corning Incorporated, Corning, NY (US)

( * ) Notice: Subject to any disclaimer, the term of this patent is extended or adjusted under 35 U.S.C. 154(b) by 464 days.

(21) Appl. No.: 11/593,768

(22) Filed: Nov. 7, 2006

(65) Prior Publication Data

US 2007/0128966 A1    Jun. 7, 2007

Related U.S. Application Data

(60) Provisional application No. 60/748,296, filed on Dec. 6, 2005.

(51) Int. Cl.
*H01J 9/24* (2006.01)

(52) U.S. Cl. ...................................... 445/24

(58) Field of Classification Search .................. 445/25, 445/24, 23; 156/272.2
See application file for complete search history.

(56) References Cited

U.S. PATENT DOCUMENTS

| | | | |
|---|---|---|---|
| 3,414,465 A | 12/1968 | Baak et al. | |
| 3,778,126 A | 12/1973 | Wilson | 316/20 |
| 3,995,941 A | 12/1976 | Nagahara et al. | 350/160 |
| 4,400,870 A | 8/1983 | Islam | 29/588 |
| 5,489,321 A | 2/1996 | Tracy et al. | 65/43 |
| 5,682,453 A | 10/1997 | Daniel et al. | 385/99 |
| 5,693,111 A | 12/1997 | Kadowaki et al. | 65/43 |
| 5,821,692 A | 10/1998 | Rogers et al. | 313/512 |
| 5,872,355 A | 2/1999 | Hueschen | 250/208.1 |
| 5,874,804 A | 2/1999 | Rogers | 313/512 |
| 5,902,665 A * | 5/1999 | Kuroda | 428/846.9 |
| 5,998,805 A | 12/1999 | She et al. | 257/40 |
| 6,069,443 A | 5/2000 | Jones et al. | 313/504 |
| 6,129,603 A | 10/2000 | Sun et al. | 445/25 |
| 6,137,221 A | 10/2000 | Roitman et al. | 313/504 |
| 6,146,225 A | 11/2000 | Sheats et al. | 445/24 |
| 6,226,890 B1 | 5/2001 | Boroson et al. | 34/472 |
| 6,268,695 B1 | 7/2001 | Affinito | 313/504 |
| 6,356,376 B1 | 3/2002 | Tonar et al. | 359/267 |
| 6,370,019 B1 | 4/2002 | Matthies et al. | 361/681 |
| 6,465,953 B1 | 10/2002 | Duggal | 313/553 |
| 6,470,549 B1 | 10/2002 | Boroson et al. | 34/335 |
| 6,501,044 B1 | 12/2002 | Klockhaus et al. | 219/121.64 |
| 6,733,850 B1 | 5/2004 | Domi et al. | 428/34 |
| 6,998,776 B2 | 2/2006 | Aitken et al. | 313/512 |

(Continued)

FOREIGN PATENT DOCUMENTS

JP        58-211743        9/1983

(Continued)

*Primary Examiner*—Toan Ton
*Assistant Examiner*—Hana A Sanei
(74) *Attorney, Agent, or Firm*—Kevin M. Able

(57) ABSTRACT

A method of encapsulating a display device between substrates with a glass frit. The method includes depositing a frit having an optical absorption $\alpha$ which is a function of wavelength onto a first substrate wherein the deposited frit has a height h, placing a second substrate in contact with the frit, sealing together the substrates by traversing a laser light having a wavelength $\lambda$ over the frit at a speed greater than about 5 mm/s, and wherein $\alpha \cdot h$ at $\lambda$ is between 0.4 and about 1.75.

15 Claims, 3 Drawing Sheets

U.S. PATENT DOCUMENTS

| | | | |
|---|---|---|---|
| 2001/0048234 A1 | 12/2001 | Liu et al. | 297/3 |
| 2002/0125822 A1 | 9/2002 | Graff et al. | 313/506 |
| 2002/0149312 A1 | 10/2002 | Roberts et al. | 313/495 |
| 2003/0066311 A1 | 4/2003 | Li et al. | 65/43 |
| 2004/0069017 A1 | 4/2004 | Li et al. | 65/43 |
| 2004/0207314 A1* | 10/2004 | Aitken et al. | 313/504 |
| 2005/0001545 A1 | 1/2005 | Aitken et al. | 313/512 |
| 2005/0151151 A1* | 7/2005 | Hawtof et al. | 257/100 |
| 2006/0009109 A1 | 1/2006 | Aitken et al. | 445/24 |
| 2007/0090759 A1 | 4/2007 | Choi et al. | 313/512 |
| 2007/0096631 A1 | 5/2007 | Sung et al. | 313/498 |
| 2007/0114909 A1 | 5/2007 | Park et al. | 313/495 |
| 2007/0170324 A1 | 7/2007 | Lee et al. | 248/247 |
| 2007/0170423 A1 | 7/2007 | Choi et al. | 257/40 |
| 2007/0170455 A1 | 7/2007 | Choi et al. | 257/100 |
| 2007/0170605 A1 | 7/2007 | Lee et al. | 264/1.1 |
| 2007/0170839 A1 | 7/2007 | Choi et al. | 313/500 |
| 2007/0170845 A1 | 7/2007 | Choi et al. | 313/504 |
| 2007/0170846 A1 | 7/2007 | Choi et al. | 313/504 |
| 2007/0170849 A1 | 7/2007 | Park | 313/506 |
| 2007/0170850 A1 | 7/2007 | Choi et al. | 313/506 |
| 2007/0170854 A1 | 7/2007 | Kwak | 313/512 |
| 2007/0170855 A1 | 7/2007 | Choi et al. | 313/512 |
| 2007/0170856 A1 | 7/2007 | Cha | 313/512 |
| 2007/0170859 A1 | 7/2007 | Choi et al. | 313/512 |
| 2007/0170860 A1 | 7/2007 | Choi et al. | 313/512 |
| 2007/0170861 A1 | 7/2007 | Lee et al. | 313/512 |
| 2007/0171637 A1 | 7/2007 | Choi | 362/227 |
| 2007/0173167 A1 | 7/2007 | Choi | 445/25 |

FOREIGN PATENT DOCUMENTS

| | | |
|---|---|---|
| JP | 10-074583 | 3/1998 |
| JP | 2003-187962 | 4/2003 |
| WO | WO93/12049 | 6/1993 |
| WO | WO01/44865 | 6/2001 |
| WO | WO02/05361 | 1/2002 |
| WO | WO02/21557 | 3/2002 |
| WO | WO03/005774 | 1/2003 |

* cited by examiner

METHOD OF ENCAPSULATING A DISPLAY ELEMENT

This application claims the benefit of priority under 35 U.S.C. § 119(e) of U.S. Provisional Application Ser. No. 60/748,296 filed on Dec. 6, 2005, the content of which is incorporated herein in its entirety by reference.

BACKGROUND OF THE INVENTION

1. Field of the Invention

The present invention relates to hermetically sealed glass packages suitable to protect thin film devices which are sensitive to the ambient environment, and more particularly to a method of sealing such devices

2. Technical Background

OLEDs have been the subject of considerable research in recent years because of their use and potential use in a wide variety of electroluminescent devices. For instance, a single OLED can be used in a discrete light emitting device or an array of OLEDs can be used in lighting or flat-panel display applications (e.g., OLED displays). OLED flat panel displays in particular are known to be very bright and to have good color contrast and wide viewing angle. It is well known that the life of the OLED display can be significantly increased if the electrodes and organic layers located therein are hermetically sealed from the ambient environment. However, OLED displays, and in particular the electrodes and organic layers located therein, are susceptible to degradation resulting from interaction with oxygen and moisture leaking into the OLED display from the ambient environment. Unfortunately, in the past it has been very difficult to develop a sealing process to hermetically seal the OLED display. Some of the factors that made it difficult to properly seal the OLED display are briefly mentioned below:

- The hermetic seal should provide a barrier for oxygen ($10^{-3}$ cc/m$^2$/day) and water ($10^{-6}$ g/m$^2$/day).
- The size of the hermetic seal should be minimal (e.g., <2 mm) so it does not have an adverse effect on size of the OLED display.
- The temperature generated during the sealing process should not damage the materials (e.g., electrodes and organic layers) within the OLED display. For instance, the first pixels of OLEDs which are located about 1-2 mm from the seal in the OLED display should not be heated to more than 100° C. during the sealing process.
- The gases released during sealing process should not contaminate the materials within the OLED display.
- The hermetic seal should enable electrical connections (e.g., thin-film chromium electrodes) to enter the OLED display.

One way to seal the OLED display is to form a hermetic seal by melting a low temperature frit doped with a material that is highly absorbent at a specific wavelength of light. For example, a high power laser may be used to heat and soften the frit which forms a hermetic seal between a cover glass with the frit located thereon and a substrate glass with OLEDs located thereon. The frit is typically ~1 mm wide and ~6-100 um thick. If the absorption and thickness of the frit is uniform then sealing can be done at a constant laser energy and translation speed so as to provide a uniform temperature rise at the frit location. However, when the frit is relatively thin, 100% of the laser energy is not absorbed by the frit. For example, some of the laser energy can be absorbed or reflected by metal electrodes that are attached to the OLEDs on the substrate glass. Since it is desirable to use thin frits, and the metal electrodes have different reflectivity and absorption properties as well as different thermal conductivities from the bare substrate glass, this situation can create an uneven temperature distribution within the frit during the sealing process which subsequently can lead to a non-hermetic connection between the cover glass and the substrate glass. In addition, high absorption by the electrodes may result in overheating of, and subsequent damage to, the electrodes. This sealing problem is solved by using one or more of the sealing techniques of the present invention.

SUMMARY

Embodiments of the present invention provide a method for sealing together two substrates, such as glass substrates for an OLED display device.

Briefly described, one embodiment of the method/apparatus/system, among others, can be implemented as described herein.

In one embodiment, a method for encapsulating a display element is provided comprising depositing a frit having an optical absorption a which is a function of wavelength onto a first substrate wherein the deposited frit has a height h, placing the first substrate on a second substrate with the frit therebetween, sealing together the substrates by traversing a laser light having a wavelength $\lambda$ over the frit at a speed greater than about 5 mm/s and wherein $\alpha \cdot h$ at $\lambda$ is greater than or equal to about 0.4, preferably between 0.4 and about 1.75 and more preferably between about 0.5 and 1.3.

In another embodiment of the invention a method is disclosed comprising depositing a frit having an optical absorption a which is a function of wavelength onto a first substrate in the shape of a wall having a height h, sandwiching the frit between the first substrate and a second substrate, the second substrate having a display element and at least one electrode disposed thereon, the at least one electrode extending between the frit and the second substrate, traversing a laser light having a wavelength $\lambda$ over the frit through the first substrate at a speed greater than about 5 mm/s to heat and melt the frit, thereby sealing together the first and second substrates; and wherein $\alpha \cdot h$ at $\lambda$ is greater than or equal to about 0.4, preferably between about 0.4 and about 1.75 and more preferably between about 0.5 and 1.3.

In still another embodiment, a method of encapsulating a display element is provided comprising depositing a frit having an optical absorption a which is a function of wavelength onto a first substrate in the form of a wall having a height h, pre-sintering the frit, placing the first substrate overtop a second substrate having one or more display elements comprising an organic material, and at least one metallic electrode, disposed thereon, such that the display element is encircled by the wall and the at least one electrode passes beneath the frit, heating the frit through the first substrate using a laser light having a peak wavelength $\lambda$ to melt the frit and form a hermetic seal between the first and second substrates and wherein $\alpha \cdot h$ at $\lambda$ is greater than or equal to about 0.4, preferably between about 0.4 and about 1.75 and more preferably between about 0.5 and 1.3.

The invention will be understood more easily and other objects, characteristics, details and advantages thereof will become more clearly apparent in the course of the following explanatory description, which is given, without in any way implying a limitation, with reference to the attached Figures. It is intended that all such additional systems, methods features and advantages be included within this description, be within the scope of the present invention, and be protected by the accompanying claims.

DETAILED DESCRIPTION

Figure 1:
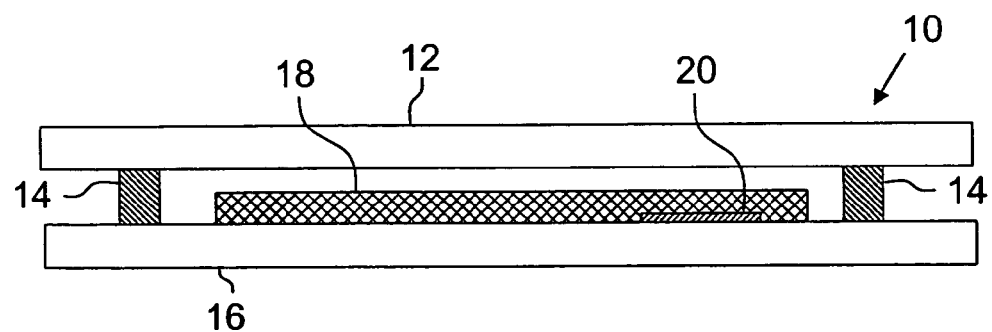
FIG. 1 is a cross sectional side view of a display device according to the present invention.

In the following detailed description, for purposes of explanation and not limitation, example embodiments disclosing specific details are set forth to provide a thorough understanding of the present invention. However, it will be apparent to one having ordinary skill in the art, having had the benefit of the present disclosure, that the present invention may be practiced in other embodiments that depart from the specific details disclosed herein. Moreover, descriptions of well-known devices, methods and materials may be omitted so as not to obscure the description of the present invention. Finally, wherever applicable, like reference numerals refer to like elements.

Although the sealing techniques of the present invention are described below with respect to manufacturing a hermetically sealed OLED display, it should be understood that the same or similar sealing techniques can be used to seal two glass plates to one another that can be used in a wide variety of applications and device. Accordingly, the sealing techniques of the present invention should not be construed in a limited manner.

Referring to FIG. 1 is shown a cross-sectional side view of a hermetically sealed OLED display device in accordance with an embodiment of the present invention, generally designated by reference numeral 10 comprising first substrate 12, frit 14, second substrate 16, at least one OLED element 18 and at least one electrode 20 in electrical contact with the OLED element. Although only a single OLED element is shown for simplicity, display device 10 may have many OLED elements disposed therein. OLED display 10 can be an active OLED display 10 or a passive OLED display 10. In addition, it should be appreciated that another type of thin film device can be deposited besides OLEDs 18 if an OLED display 10 is not being made but instead another glass package like one used in an optical sensor is going to be made using the sealing technique(s) of the present invention.

In a preferred embodiment, first substrate 12 is a transparent glass plate like the ones manufactured and sold by Corning Incorporated under the brand names of Code 1737 glass or Eagle 2000™ glass. Alternatively, first substrate 12 can be any transparent glass plates like, for example, the ones manufactured and sold by Asahi Glass Co. (e.g., OA10 glass and OA21 glass), Nippon Electric Glass Co., NHTechno and Samsung Corning Precision Glass Co. Second substrate 16 may be the same glass substrate as first substrate 12, or second substrate 16 may be a non-transparent substrate.

Figure 2:
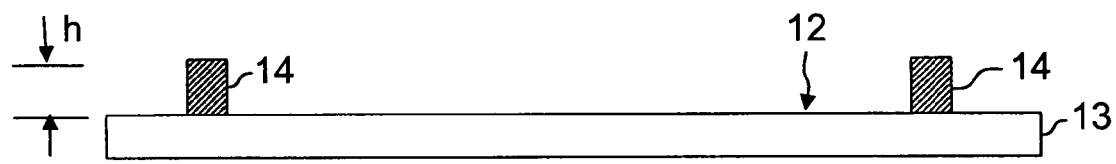
FIG. 2 is a cross sectional side view of the first substrate and the frit deposited thereon.
Figure 3:
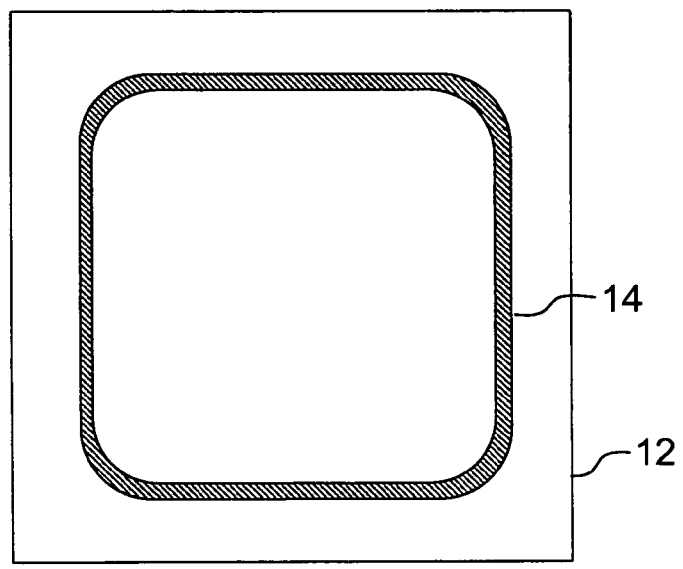
FIG. 3 is a top view of the first substrate of FIG. 2 showing the frit deposited in the shape of a picture frame-like wall.
Figure 4:
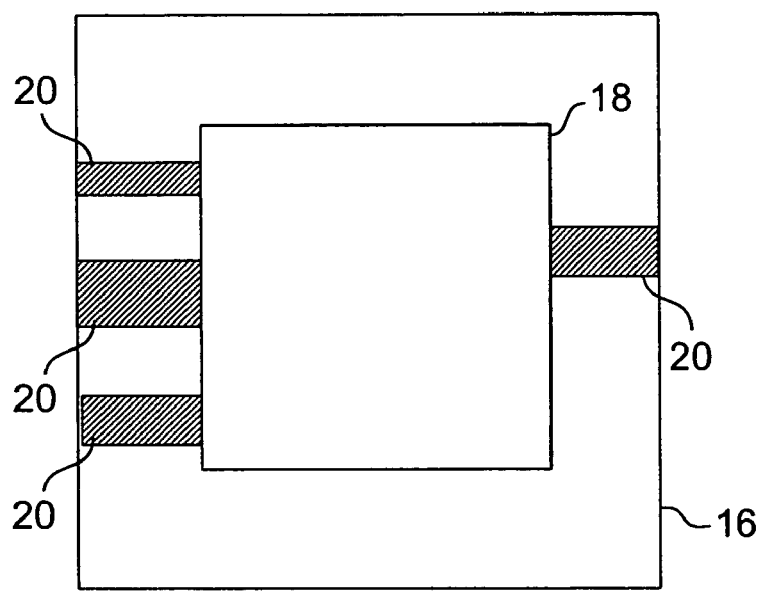
FIG. 4 is a top view of the second substrate having a display element and electrodes deposited thereon.

As shown in FIGS. 2-3, prior to sealing first substrate 12 to second substrate 16, frit 14 is deposited on first substrate 12. Frit 14 can be applied to first substrate 12 by screen-printing or by a programmable auger robot which provides a well-shaped pattern on first substrate 12. For example, frit 14 can be deposited approximately 1 mm away from the free edges of first substrate 12. Preferably, the frit is deposited as a closed wall structure which, when the OLED display is assembled, encircles the OLED element analogous to a picture frame. The frit may be deposited in a pattern of one or more encircling frame-like frit walls. In a preferred embodiment, frit 14 is a low temperature glass frit that has a substantial absorption cross-section at a predetermined wavelength which matches the operating wavelength of a laser used in the sealing process. Frit 14 may, for example, contain one or more absorbing ions chosen from the group including iron, copper, vanadium, neodymium and combinations thereof (for example). Frit 14 may also be doped with a filler (e.g., inversion filler, additive filler) which changes the coefficient of thermal expansion of frit 14 so that it matches or substantially matches the coefficient of thermal expansions of substrates 12 and 16. Such frits generally have a thermal conductivity greater than about 500 $\mu m^2/s$, and typically about 800 $\mu m^2/s$, but may have a thermal conductivity in excess of 1000 $\mu m^2/s$. For a more detailed description regarding exemplary frit compositions that may be used in this application, reference is made to U.S. patent application Ser. No. 10/823,331 entitled "Glass Package that is Hermetically Sealed with a Frit and Method of Fabrication", the contents of which are incorporated by reference herein.

Frit 14 may also be pre-sintered prior to sealing first substrate 12 to second substrate 16. To accomplish this, frit 14 which was deposited onto first substrate 12 is heated so that it becomes attached to first substrate 12. Then, first substrate 12 with the frit pattern located thereon can then be placed in a furnace which "fires" frit 14 at a temperature that depends on the composition of the frit. During the pre-sintering phase, frit 14 is heated and organic binder materials contained within the frit are burned out.

After frit 14 is pre-sintered, it can be ground, if necessary, so that the height variation does not exceed about 2-4 μm with a typical target height h which can be 10 μm to greater than 30 μm, depending on the application for the device, however more typically height h is about 12-15 μm. If the height variation is larger, the gap may not close when frit 12 melts during laser sealing to a second substrate, or the gap may introduce stresses which can crack the substrates. Frit 12 height h is an important variable which allows the substrates to be sealed from the backside (i.e. through first substrate 12). If frit 14 is too thin it does not leave enough material to absorb the laser irradiation, resulting in failure. If frit 14 is too thick it will be able to absorb enough energy at the first surface to melt the frit proximate the first surface, but the energy needed to melt the frit proximate the second surface may be prevented from reaching that region of the frit (i.e. proximate secondary substrate 16) due to the thermal conductivity of the frit. This latter scenario is a rate limiting situation for sealing substrates with a thick frit layer, and may result in poor or spotty bonding of the two glass substrates.

After the pre-sintered frit 14 is ground, first substrate 12 may go through a mild ultrasonic cleaning environment to remove any debris that has accumulated to this point. The typical solutions used here can be considerably milder than the ones used for cleaning display glass which has no additional deposition. During cleaning, the temperature can be kept lower to avoid degradation of deposited frit 14.

After cleaning, a final processing step can be performed to remove residual moisture. The pre-sintered first substrate 12 can be placed in a vacuum oven at a temperature of 100° C. for 6 or more hours. After removal from the oven, the pre-sintered first substrate 12 can be placed in a clean room box to deter dust and debris from accumulating on it before performing the sealing process.

FIG. 3 illustrates second substrate 16, prior to sealing to first substrate 12, comprising one or more OLED elements 18 and one or more electrodes 20 for connecting the OLED element to other devices. The typical OLED 18 includes one or more organic layers (not shown) and anode/cathode electrodes 20. However, it should be readily appreciated by those skilled in the art that any known OLED 18 or future OLED 18 can be used in the OLED display 10.

The sealing process includes placing first substrate 12, with frit 14, on top of second substrate 16, with one or more OLEDs 18 and one or more electrodes 20 located on top of the second substrate, in such a manner that frit 14 is sandwiched between the two substrates 12 and 16, and the frame-like pattern of frit 14 encircles the at least one OLED element. Electrodes 20 pass beneath frit 14. Mild pressure can be applied to substrates 12 and 16 to keep them in contact during the sealing process. As shown in the close-up view of a portion of display device 10 depicted in FIG. 5, laser 22 directs its beam 24 on frit 14 through first substrate 12 and heats frit 14 such that frit 14 melts and forms a hermetic seal which connects and bonds substrate 12 to substrate 16. The hermetic seal also protects OLEDs 18 by preventing oxygen and moisture in the ambient environment from entering into OLED display 10.

Laser beam 24 can be defocused, for example to an approximately 3.5 mm spot diameter, to make the temperature gradient within frit 14 more gradual. Frit 14 generally needs a warm up and anneal phase before melting. In addition, the pre-sintered first substrate should be stored in an inert atmosphere to prevent re-adsorption of $O_2$ and $H_2O$ before melting. The velocity of travel of the laser 22 to the frit pattern can range from between about 0.5 mm/s to in excess of 40 mm/s, and as high as 300 mm/s depending on the set parameters. The power necessary may vary depending on the absorption coefficient α and thickness (height) h of frit 14. The necessary power is also affected if a reflective or absorbent layer is placed beneath frit 14 such as certain lead materials 20, and by the speed of traverse of the laser over the frit. Additionally, frit 14 can vary depending on the homogeneity of the frit, along with the filler particle size. This too can adversely affect the way the frit absorbs and consequently melts to substrates 12 and 16.

Figure 5:
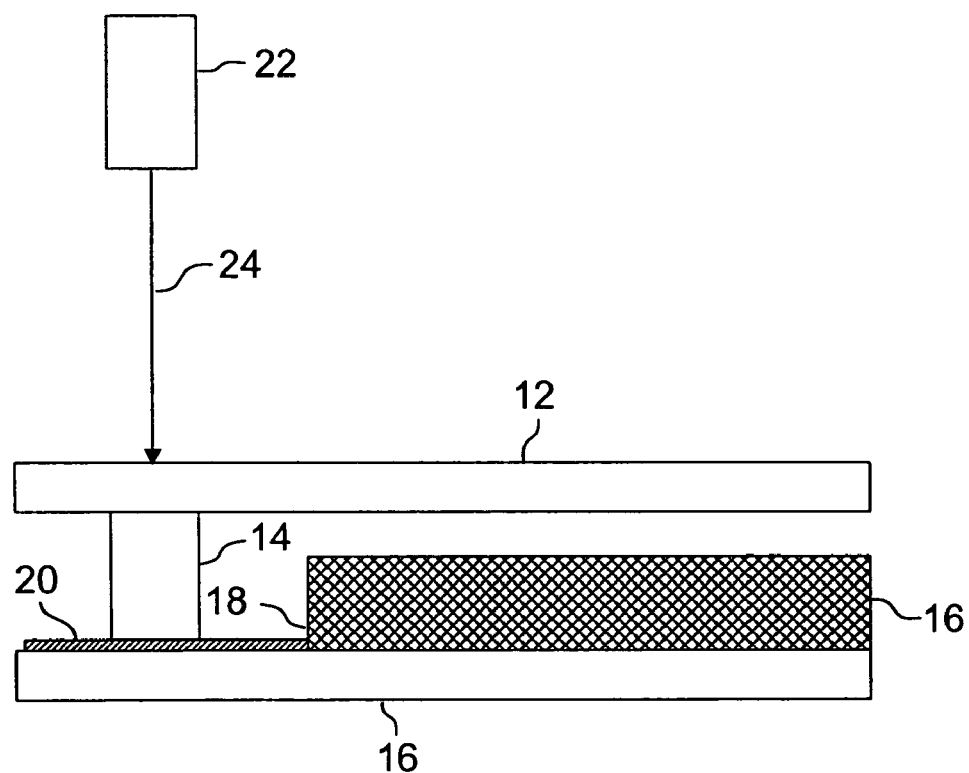
FIG. 5 is a partial cross sectional view of the display device of FIG. 1 showing the position of the laser and laser beam during the sealing operation.
Figure 6:
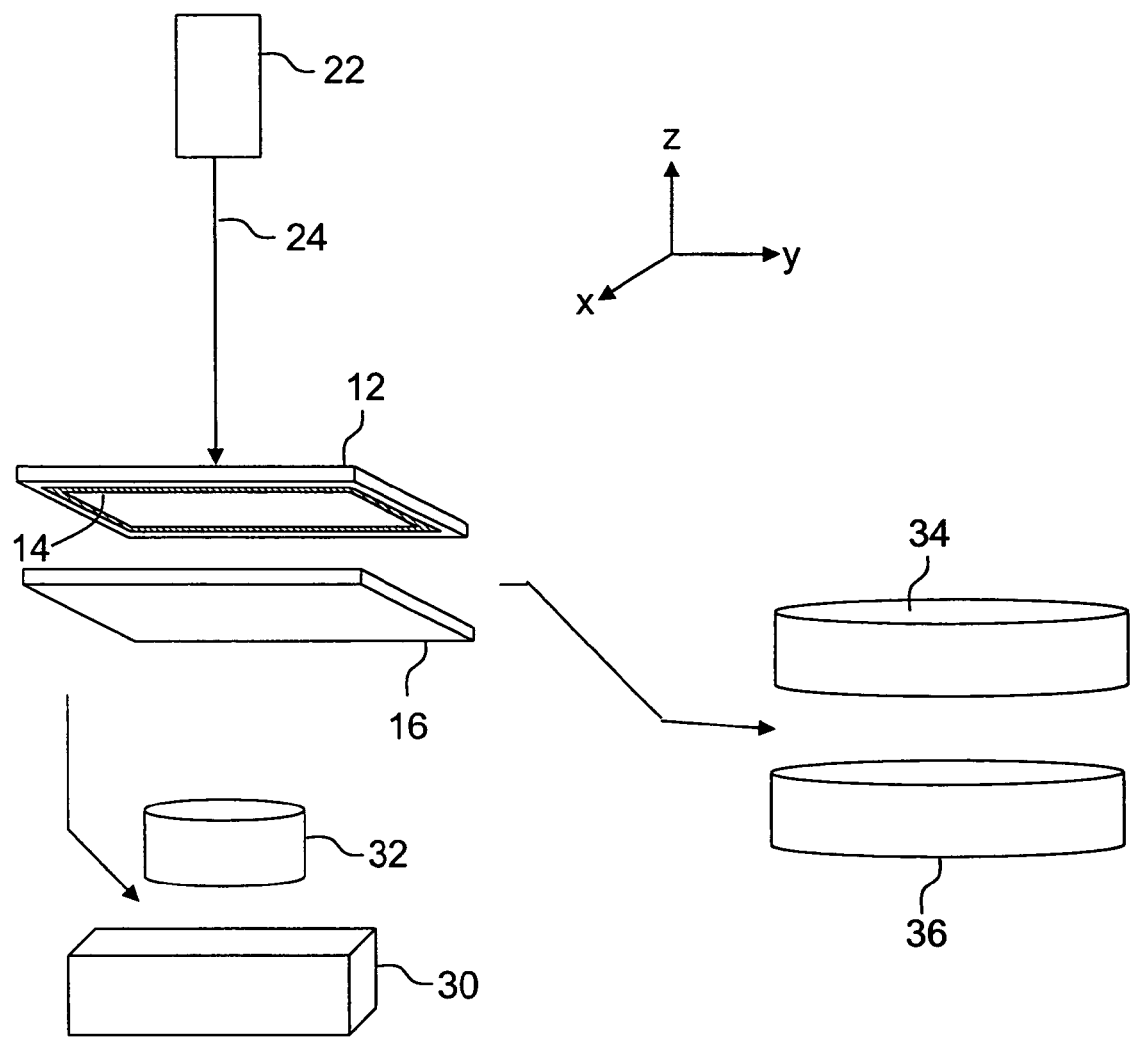
FIG. 6 is a diagram showing several strategies for sealing the first and second substrates.

FIGS. 5-6 illustrate the concept of how substrates 12 and 16 are placed in reference to laser 22. A lens system (not shown) may be included but is not a requirement for delivery of energy from laser 22. Again, the laser beam 24 can be defocused to reduce the temperature gradient as frit 14 is traversed by the laser beam 24. It should be noted that if the gradient is too steep (focus is too tight) that the OLED display 10 may exhibit violent cracking resulting in immediate failure.

Several exemplary strategies that can be used to hold first substrate 12, including frit 14, in close contact with second substrate 16 for sealing purposes are shown in FIG. 6. The first approach is one where substrates 12 and 16 are placed on a steel block 30 with a magnet 32 on top of substrates 12 and 16. The other approach is to place the substrates 12 and 16 between two clear silica discs 34 and 36 with low scratch/dig and extremely high flatness. These silica discs 34 and 36 can then be clamped in a variety of methods and are transparent to the near infrared irradiation. If the discs 34 and 36 are flat and extremely stiff, then relatively thin substrates 12 and 16 can adhere to their shape, maintaining flatness and direct contact with each other.

The motion of a stage (not shown) which holds substrates 12 and 16 can be controlled by a computer (not shown) which runs programs written to trace the pattern of frit 14 that has been dispensed onto first substrate 12. Most frit 14 patterns are rectangular in shape and have rounded corners. The radius of curvatures for the corners range between 0.5 mm and 4 mm and are necessary to reduce overheating in this area. Overheating can occur as the travel motion in the x direction is reduced while the y direction is increased and vice versa. To negate this effect of overheating, velocity, power, or radius of the laser beam 24 can be adjusted. For example, this effect can be overcome solely by keeping a radius of curvature larger than the overlap of the defocused laser beam 24.

Because frit 14 is to some degree transparent, any layer, like electrodes 20 that resides under it, that are reflective, will create an additional heat source because the laser beam 24 reflects back into frit 14. It is not a double dose, but substantially more than what is intended. Also, some of these electrodes 20 can be absorptive in the near IR which means they can have some substantial heating when irradiated by the laser source 22. When electrodes 20 exhibit both properties, it creates a very difficult effect to overcome with a sealing regime. This effect is considered a power density per unit time issue. Because electrodes 20 are scattered and placed indeterminately of where frit 14 is to be placed, it is necessary to manage the power density issue.

The sealing techniques of the present invention enable sealing laser 22 to heat and melt frit 14 during the sealing process, even though electrodes 20, that have different patterns and properties, pass under frit 14. Using the sealing techniques of the present invention, damage to the electrodes during the sealing process can be avoided. To accomplish this, the sealing techniques should take into account several factors which can affect the rate of the heat diffusion and in turn the temperature of the frit 14 at the sealing point. First, as described above, the typical frit 14 transmission can vary from 2% to 30% depending on its composition and thickness. Second, electrodes 20, depending on their composition, can absorb or reflect the light transmitted through frit 14.

In general, the relationship between the traverse speed V of the laser and the absorption α (in units of inverse distance, e.g. 1/μm) of the frit can be derived from the diffusion relationship:

$$V = 4BD/r^2 \quad (1)$$

where V is the traverse speed of the laser light over frit 14, D is the thermal conductivity coefficient of the frit, r is the diffusion length in the frit and B is a scaling factor. Since the total thickness of the frit is the sum of the directly melted thickness and the thickness of the frit melted by heat diffusion, $$h = r + 1/\alpha \quad (2)$$

where α is the absorption coefficient of the frit. Thus, V can be expressed as:

$$V = 4BD/(h - 1/\alpha)^2 \quad (3)$$

which is valid for h>1/α (i.e. a highly absorbing frit). Equation (3) illustrates how closely linked are sealing (traverse) speed, absorption of the frit and thermal conductivity.

On the other hand, a lower absorbing frit may allow faster sealing speeds. Unfortunately, faster sealing speeds generally require a higher output power from the laser. In the case where the electrodes absorb the laser light (i.e. the electrodes are absorbing at the output wavelength(s) of the laser), the electrodes may be heated to a temperature sufficient to damage the electrodes. To determine an appropriate sealing speed while considering the presence of the electrodes, the following relationship may be used:

$$V = 4BD/(h - (1 + A \cdot 10^{-\alpha h})/\alpha - (R/\alpha) \cdot 10^{-\alpha h})^2 \quad (4)$$

where A is the electrode absorption and R is the electrode reflectance.

Generally, commercially viable sealing speeds exceed 5 mm/s, while optical powers greater than 10-15 watts may result in damage to electrodes at that speed. For example, optical powers in excess of about 10 W may damage chromium electrodes, and molybdenum electrodes may be damaged at optical powers in excess of about 15 W (at a spot diameter $2\omega$ less than about 1.8 mm). It is desirable that the spot diameter of the laser beam at the surface of the frit be at least as large as the width of the frit, and may be larger. As used herein, spot diameter equals $2\omega$ were w is that distance from the beam axis where the beam intensity is $1/e^2$ the maximum beam intensity. Preferably, the spot diameter of the laser beam at the surface of the frit should be between about 1.8 mm and 25 mm. Preferably, the traverse rate should be between about 0.5 mm/s and 300 mm/s. In general, peak optical powers should be between 0.5 W and 1.5 kW, depending upon traverse rate, spot diameter and so forth.

As a guide, and assuming a spot diameter of 1.8 mm which exceeds the width of the line of frit: for a traverse rate less than or equal to about 5 mm/s the peak optical power should be maintained less than about 15 W; for a traverse rate greater than 5 mm/s and less than or equal to 10 mm/s, the peak optical power should be maintained less than or equal to 25 W; for a traverse rate greater than 10 mm/s and less than or equal to 20 mm/s the peak optical power should be maintained less than about 36 W; for a traverse rate greater than 20 mm/s and less than or equal to 40 mm/s, the peak optical power should be maintained less than about 45 W. Again, these are guidelines, and the optical powers, traverse rates and spot diameter may vary for a specific application.

We have found that by selecting frit 14 to have an appropriate absorption $\alpha$ at the wavelength of the laser 22, or conversely selecting the wavelength of the laser based on the absorption properties of the frit, such that the parameter $\alpha \cdot h$ (where the height h of the frit is expressed in $\mu m$) is greater than or equal to a value of about 0.4, and preferably between a value of about 0.4 and 1.75, damage to the electrodes can be avoided without complex schemes for varying the laser power, for example, as the laser traverses the frit overtop the electrodes. More preferably, $\alpha \cdot h$ is between about 0.5 and 1.3.

It should be emphasized that the above-described embodiments of the present invention, particularly any "preferred" embodiments, are merely possible examples of implementations, merely set forth for a clear understanding of the principles of the invention. Many variations and modifications may be made to the above-described embodiments of the invention without departing substantially from the spirit and principles of the invention. All such modifications and variations are intended to be included herein within the scope of this disclosure and the present invention and protected by the following claims.

What is claimed is:

1. A method for encapsulating a display element comprising:
   depositing a frit having an optical absorption $\alpha$ which is a function of wavelength onto a first substrate in the shape of a wall having a height h;
   sandwiching the frit between the first substrate and a second substrate having a display element and at least one electrode disposed thereon, the at least one electrode extending between the frit and the second substrate;
   heating the frit by traversing a laser light having a wavelength $\lambda$ over the frit through the first substrate at a speed greater than about 40 mm/s to melt the frit and seal together the first and second substrates; and
   wherein $\alpha \cdot h$ at $\lambda$ is greater than or equal to about 0.4.

2. The method according to claim 1 wherein the display element comprises an organic material.

3. The method according to claim 1 further comprising prior to the step of sandwiching, pre-sintering the frit.

4. The method according to claim 1 wherein a spot diameter $2\omega$ of the laser beam at a surface of the frit is equal to or greater than a width of the frit.

5. The method according to claim 1 wherein $\alpha \cdot h$ is between about 0.5 and about 1.3 at $\lambda$.

6. The method according to claim 1 wherein h is between 12 and 15 $\mu m$.

7. The method according to claim 1 wherein a thermal conductivity of the frit is greater than about 500 $\mu m^2/s$.

8. The method according to claim 1 wherein the laser beam has a peak optical power at $\lambda$, and the peak optical power is less than 45 W.

9. A method of encapsulating a display element comprising:
   depositing a frit selected to have an optical absorption $\alpha$ at a wavelength $\lambda$ onto a first substrate as a wall having a height h between 10 $\mu m$ and 30 $\mu m$;
   pre-sintering the frit;
   placing the first substrate overtop a second substrate having one or more display elements comprising an organic material and at least one metallic electrode disposed thereon, such that the display element is encircled by the wall and the at least one electrode passes beneath the frit;
   heating the frit through the first substrate by traversing a laser beam having a peak optical power at wavelength $\lambda$ over the frit at a speed greater than 20 mm/s to melt the frit and form a hermetic seal between the first and second substrates; and
   wherein the frit is selected such that $\alpha \cdot h$ at $\lambda$ is greater than or equal to about 0.4.

10. The method according to claim 9 wherein $\alpha \cdot h$ is between about 0.5 and about 1.3 at $\lambda$.

11. The method according to claim 9 wherein a thermal conductivity of the frit is greater than about 500 $\mu m^2/s$.

12. The method according to claim 9 wherein the peak optical power of the laser beam is between about 0.5 W and 1.5 kW.

13. The method according to claim 9 wherein the laser beam is traversed at a speed greater than about 40 mm/s.

14. The method according to claim 9 wherein the frit has a thermal conductivity greater than about 800 $mm^2/s$.

15. The method according to claim 9 wherein the laser beam peak optical power is less than 45 W.

* * * * *

UNITED STATES PATENT AND TRADEMARK OFFICE
CERTIFICATE OF CORRECTION

PATENT NO. : 7,597,603 B2  Page 1 of 1
APPLICATION NO. : 11/593768
DATED : October 6, 2009
INVENTOR(S) : Keith James Becken et al.

It is certified that error appears in the above-identified patent and that said Letters Patent is hereby corrected as shown below:

| Col. | Line | Description |
|---|---|---|
| 2 | 22 | After "absorption" please delete "a" and insert --α-- |
| 2 | 32 | After "tion" please delete "a" and insert --α-- |
| 2 | 46 | After "absorption" please delete "a" and insert --α-- |

Signed and Sealed this

Twenty-second Day of December, 2009

David J. Kappos
*Director of the United States Patent and Trademark Office*